(12) United States Patent
Lei et al.

(10) Patent No.: US 11,658,014 B2
(45) Date of Patent: May 23, 2023

(54) APPARATUSES AND METHODS OF PROTECTING NICKEL AND NICKEL CONTAINING COMPONENTS WITH THIN FILMS

(71) Applicant: APPLIED MATERIALS, INC., Santa Clara, CA (US)

(72) Inventors: Pingyan Lei, San Jose, CA (US); Dien-Yeh Wu, San Jose, CA (US); Xiao Ming He, Santa Clara, CA (US); Jennifer Y. Sun, Fremont, CA (US); Lei Zhou, San Jose, CA (US); Takashi Kuratomi, Campbell, CA (US); Avgerinos V. Gelatos, Scotts Valley, CA (US); Mei Chang, Santa Clara, CA (US); Steven D. Marcus, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 73 days.

(21) Appl. No.: 16/846,295

(22) Filed: Apr. 11, 2020

(65) Prior Publication Data
US 2021/0319983 A1    Oct. 14, 2021

(51) Int. Cl.
*C23C 16/06*    (2006.01)
*C23C 16/44*    (2006.01)
*H01J 37/32*    (2006.01)
*H01L 21/67*    (2006.01)
(Continued)

(52) U.S. Cl.
CPC ........ *H01J 37/32477* (2013.01); *C23C 16/06* (2013.01); *C23C 16/4404* (2013.01); *C23C 16/45536* (2013.01); *C23C 16/45544* (2013.01); *C23C 16/45565* (2013.01); *H01J 37/32467* (2013.01); *H01L 21/28556* (2013.01); *H01L 21/67017* (2013.01); *H01J 2237/3321* (2013.01)

(58) Field of Classification Search
CPC ... C23C 16/06; C23C 16/403; C23C 16/4404; C23C 16/45536
See application file for complete search history.

(56) References Cited

U.S. PATENT DOCUMENTS

| | | |
|---|---|---|
| 2004/0045503 A1 | 3/2004 | Lee et al. |
| 2008/0254231 A1* | 10/2008 | Lin .................. C23C 16/45525 |
| | | 427/576 |
| 2017/0314125 A1 | 11/2017 | Fenwick et al. |

(Continued)

FOREIGN PATENT DOCUMENTS

JP    08-311692 A    11/1996

OTHER PUBLICATIONS

International Search Report for PCT/US2021/026449, dated Jul. 28, 2021.

*Primary Examiner* — Elizabeth A Burkhart
(74) *Attorney, Agent, or Firm* — Moser Taboada

(57) ABSTRACT

Methods and apparatus for depositing a coating on a semiconductor manufacturing apparatus component are provided herein. In some embodiments, a method of depositing a coating on a semiconductor manufacturing apparatus component includes: sequentially exposing a semiconductor manufacturing apparatus component including nickel or nickel alloy to an aluminum precursor and a reactant to form an aluminum containing layer on a surface of the semiconductor manufacturing apparatus component by a deposition process.

17 Claims, 4 Drawing Sheets

100

```
SEQUENTIALLY EXPOSING A SEMICONDUCTOR
   MANUFACTURING APPARATUS COMPONENT
 COMPRISING NICKEL OR NICKEL ALLOY TO AN
ALUMINIUM PRECURSOR AND A REACTANT TO FORM   ~120
AN ALUMINIUM CONTAINING LAYER ON A SURFACE OF
  THE SEMICONDUCTOR MANUFACTURING APPARATUS
      COMPONENT BY A DEPOSITION PROCESS
```

(51) Int. Cl.
 *C23C 16/455* (2006.01)
 *H01L 21/285* (2006.01)

(56) References Cited

U.S. PATENT DOCUMENTS

| | | | |
|---|---|---|---|
| 2018/0112311 A1* | 4/2018 | Fenwick | ................. C23C 14/08 |
| 2018/0265973 A1* | 9/2018 | Firouzdor | ......... C23C 16/45527 |
| 2019/0100842 A1 | 4/2019 | Hendrix et al. | |
| 2019/0185999 A1 | 6/2019 | Shanbhag et al. | |

* cited by examiner

100

APPARATUSES AND METHODS OF PROTECTING NICKEL AND NICKEL CONTAINING COMPONENTS WITH THIN FILMS

FIELD

Embodiments of the present disclosure generally relate to deposition processes such as vapor deposition processes for depositing films on semiconductor manufacturing components.

BACKGROUND

Semiconductor manufacturing equipment such as a chemical vapor deposition chambers have components which corrode or degrade over time due to being exposed to hot gases and/or reactive chemicals. For example, the inventors have found a showerhead component of a deposition chamber made of nickel or nickel containing material such as nickel alloys problematically degrade when subjected to hot gases and harsh chemical reaction conditions including reactants such as silanes. The degradation of one or more deposition chamber components such as a showerhead will detrimentally impact the surface and bulk properties of the components in the manufacturing equipment and promote or result in alterations in chemical process conditions and/or defects of the semiconductor device to be manufactured therein.

The inventors have observed coatings upon nickel and nickel alloy components in semiconductor manufacturing equipment are problematic in that coatings may be too thin to be protective or may adhere poorly to an adjacent contacting surface. Further, the inventors have observed coatings deposited upon nickel and nickel alloy components may be too brittle reducing the life of the component when exposed to stress such as high temperature and/or reactive gases.

Therefore, protective coatings atop nickel and/or nickel alloy semiconductor manufacturing equipment components and methods for depositing the protective coatings atop nickel and/or nickel alloy semiconductor manufacturing apparatus components are needed.

SUMMARY

Methods and apparatus for depositing a coating on a semiconductor manufacturing apparatus component are provided herein. In some embodiments, a method of depositing a coating on a semiconductor manufacturing apparatus component includes sequentially exposing a semiconductor manufacturing apparatus component including nickel or nickel alloy to an aluminum precursor and a reactant to form an aluminum containing layer on a surface of the semiconductor manufacturing apparatus component by a deposition process.

In some embodiments, a method of depositing a coating on a semiconductor manufacturing apparatus component includes: sequentially exposing a semiconductor manufacturing apparatus component having a first surface including nickel or nickel alloy to a first precursor and a first reactant to form a buffer layer having a top surface on the first surface by a first vapor deposition process; and exposing an aluminum precursor and a second reactant to form an aluminum containing layer on the top surface by a second vapor deposition process.

In some embodiments, the present disclosure relates to a semiconductor manufacturing apparatus component, including: an aluminum containing layer disposed on a nickel or nickel alloy surface of the semiconductor manufacturing apparatus component, wherein the semiconductor manufacturing apparatus component is one or more of a showerhead, a wall, a lid, a ring, a bottom, a blocker plate, or a substrate support assembly.

In some embodiments, the present disclosure relates to a non-transitory computer readable medium having instructions stored thereon that, when executed, cause a deposition chamber to deposit a coating on a semiconductor manufacturing apparatus component by sequentially exposing a semiconductor manufacturing apparatus component including nickel or nickel alloy to an aluminum precursor and a reactant to form an aluminum containing layer on a surface of the semiconductor manufacturing apparatus component by a deposition process.

In some embodiments, the present disclosure relates to a non-transitory computer readable medium having instructions stored thereon that, when executed, cause a deposition chamber to deposit a coating on a semiconductor manufacturing apparatus component by sequentially exposing a semiconductor manufacturing apparatus component having a first surface comprising nickel or nickel alloy to a first precursor and a first reactant to form a buffer layer having a top surface on the first surface by a first vapor deposition process; and exposing an aluminum precursor and a second reactant to form an aluminum containing layer on the top surface by a second vapor deposition process.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to protective coatings, such as metal oxide film or film stacks disposed on semiconductor manufacturing equipment components and methods for depositing the protective coatings. Non-limiting examples of semiconductor manufacturing equipment components to be coated in accordance with the present disclosure may include one or more showerheads, heater assemblies, heated chucks, backing plates or any other semiconductor manufacturing equipment components, part or portion thereof that can benefit from having protective coating of the present disclosure deposited thereon or adhered thereto. The protective coatings of the present disclosure can be deposited or otherwise formed on interior surfaces and/or exterior surfaces of the semiconductor manufacturing equipment components. In embodiments, the protective coatings of the present disclosure are deposited on or directly atop a semiconductor manufacturing apparatus component or a top surface of the semiconductor manufacturing apparatus component including metallic nickel, nickel alloy, super alloy including nickel, or a nickel-platinum alloy as described below.

In one or more embodiments, a method for depositing a coating on a semiconductor manufacturing apparatus component, includes sequentially exposing a semiconductor manufacturing apparatus component or portion thereof including nickel or nickel alloy to an aluminum precursor and a reactant to form an aluminum containing layer on a surface of the semiconductor manufacturing apparatus component by a deposition process. In some embodiments, the aluminum containing layer is aluminum oxide ($Al_2O_3$). The coated semiconductor manufacturing apparatus components of the present disclosure advantageously include robust components having coated nickel and/or coated nickel alloy surfaces resistant to harsh deposition conditions including high temperatures and reactive gases such as silane. In some embodiments, the coated semiconductor manufacturing apparatus components are immune from harsh chemicals such as chlorine, titanium chloride ($TiCl_3$ or ($TiCl_4$) plasma, fluorine plasma, hydrogen plasma, nitrogen plasma, silanes such as $SiH_4$ at elevated temperatures greater than 150 degrees Celsius, greater than 250 degrees Celsius, greater than 300 degrees Celsius, or between 150 degrees Celsius and 350 degrees Celsius. In embodiments, the coatings are robust and resilient and advantageously maintain or increase the life of the component when exposed to stress such as high temperature and/or reactive gases. Accordingly, the coated semiconductor manufacturing apparatus components of the present disclosure promote the formation of robust semiconductor devices made in the semiconductor manufacturing equipment including coated components in accordance with the present disclosure.

Figure 1:
FIG. 1 depicts a flow chart of a method for depositing a coating on a semiconductor manufacturing apparatus component in accordance with some embodiments of the present disclosure.
Figure 2A:
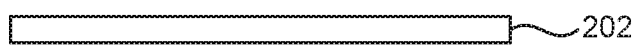
FIGS. 2A-2B depict the stages of depositing a coating on a semiconductor manufacturing apparatus component in accordance with some embodiments of the present disclosure.
Figure 2B:
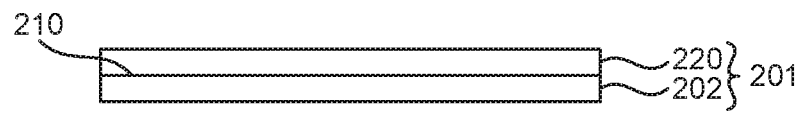
Figure 5:
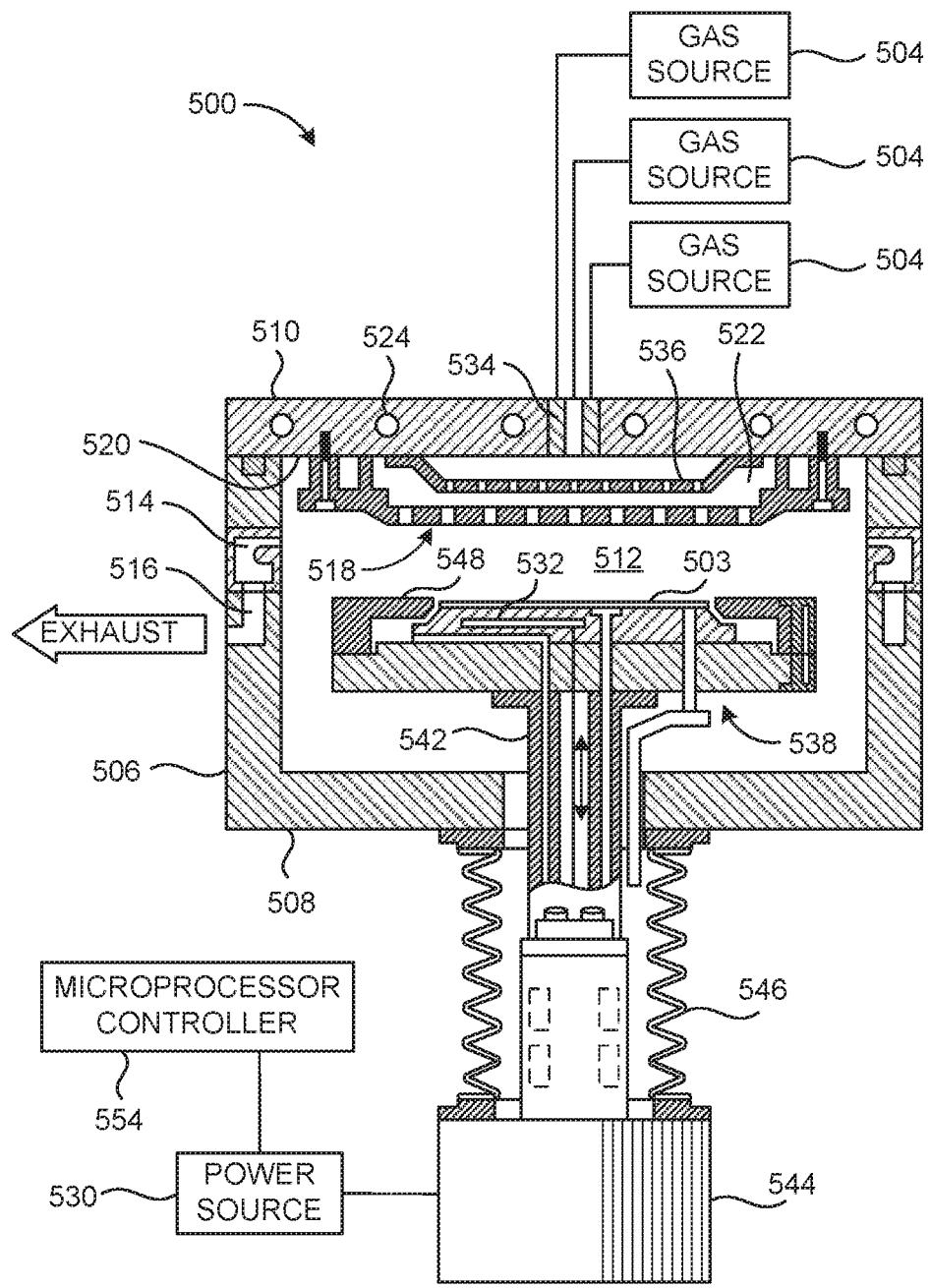
FIG. 5 depicts a deposition chamber including components for coating in accordance with the present disclosure.

FIG. 1 is a flow chart of a method 100 for depositing a coating on one or more semiconductor manufacturing components, according to one or more embodiments described and discussed herein. FIGS. 2A-2B depict the stages of depositing a coating on a semiconductor manufacturing apparatus component in accordance with method 100. FIG. 5 depicts a deposition chamber suitable for performing one or more methods in accordance with embodiments of the present disclosure as well as showing various components or portions thereof suitable as semiconductor manufacturing apparatus components for coating in accordance with the present disclosure.

Referring to FIGS. 1, 2A, and 2B, at block 120 the coated semiconductor manufacturing apparatus component 201 may be formed by sequentially exposing a semiconductor manufacturing apparatus component 202 including nickel or nickel alloy to an aluminum precursor and a reactant to form an aluminum containing layer 220 on a surface 210 of the semiconductor manufacturing apparatus component 202 by a deposition process such as a vapor deposition process. In embodiments, the vapor deposition process can be an ALD process, a plasma-enhanced ALD (PE ALD) process, a thermal chemical vapor deposition (CVD) process, a plasma-enhanced CVD (PE-CVD) process, or any combination thereof.

In embodiments, the semiconductor manufacturing apparatus component 202 may be a component, portion, or surface of the apparatus of FIG. 5 such as showerhead 518, interior side 520, lid 510, blocker plate 536 including nickel or nickel alloy or including an outer surface of nickel or nickel alloy. In some embodiments, the nickel or nickel alloy includes metallic nickel, nickel alloy, or super alloy including nickel nickel-platinum alloy. In some embodiments, the metallic nickel is of a high purity metal, such as 99.9% or greater, and may contain metallic nickel or a nickel alloy. Non-limiting examples of nickel ahoy suitable for use herein include nickel-platinum alloy, INCONEL® brand nickel-chromium-based alloys, HASTELLOY® brand nickel-molybdenum-chromium alloy or superalloy, or Monel nickel alloys including nickel and copper. In some embodiments, nickel ahoy may contain a nickel concentration by weight within a range from about 80% to about 98%, such as from about 85% to about 95%, as well as one or more other metals such as platinum, copper, molybdenum, chromium, or combinations thereof in a concentration by weight within a range from about 2% to about 20%, such as from about 5% to about 15%. In some embodiments, the nickel alloy contains nickel-platinum alloys such as NiPt5% (about 95 wt % of nickel and about 5 wt % of platinum), NiPt10% (about 90 wt % of nickel and about 10 wt % of platinum), or NiPt15% (about 85 wt % of nickel and about 15 wt % of platinum). In some embodiments the nickel includes polyalloys comprising a major portion of nickel and minor proportions of an element selected from boron or phosphorus and one or more metals such as tin, tungsten, iron, molybdenum, chromium, or copper.

In embodiments, the vapor deposition process is an ALD process and the method 100 further includes sequentially exposing the semiconductor manufacturing apparatus component 202 or surface thereof to the aluminum precursor and the reactant to form an aluminum containing layer 220 on a surface 210. In some embodiments, each cycle of the ALD process includes exposing the semiconductor manufacturing apparatus component 202 or surface thereof to the aluminum precursor, conducting a purge, exposing the semiconductor manufacturing apparatus component 202 or surface thereof to one or more reactants, and conducting another purge. In some embodiments, each cycle of the ALD process is characterized as a pump-purge and is performed to form an aluminum containing layer 220 on a surface 210 of the semiconductor manufacturing apparatus component 202. In embodiments, the order of the aluminum precursor and the reactant can be reversed, such that the ALD cycle includes exposing the semiconductor manufacturing apparatus component 202 or surface thereof to the reactant, conducting a purge, exposing the semiconductor manufacturing apparatus component 202 to the aluminum precursor, and conducting another purge to form the aluminum containing layer 220.

In some embodiments, during each ALD cycle, the semiconductor manufacturing apparatus component 202 is exposed to the aluminum precursor for about 0.05 seconds to about 10 seconds, the first reactant for about 0.05 seconds to about 10 seconds, and the purge for about 0.5 seconds to about 30 seconds. In other examples, during each ALD cycle, the semiconductor manufacturing apparatus component 202 is exposed to the aluminum precursor for about 0.05 seconds to about 3 seconds, the first reactant for about 0.05 seconds to about 3 seconds, and the purge for about 1 second to about 10 seconds. In embodiments, the first reactant is water.

In some embodiments, an ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, about 200, about 3000, about 4000, about 5000, about 5,500, about 6,000 or more times to form the aluminum containing layer 220.

In some embodiments, the vapor deposition process is a CVD process and the method includes simultaneously exposing the semiconductor manufacturing apparatus component to the aluminum precursor and the first reactant to form the aluminum containing layer 220. During an ALD process or a CVD process, each of the first precursor and the first reactant can independent include one or more carrier gases. One or more purge gases can be flowed across the semiconductor manufacturing apparatus component such as semiconductor manufacturing apparatus component 202 and/or throughout the processing chamber in between the exposures of the aluminum precursor and the first reactant in some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In some embodiments, the aluminum containing layer 220 can have a thickness sufficient to protect the semiconductor manufacturing apparatus component 202 from harsh conditions as mentioned herein. In some embodiments, the aluminum containing layer 220 can have a thickness of about 1.0 nm to 1,500 nm, or about 100 nm to 1,000 nm for example, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, about 150 nm, about 200 nm, about 300 nm, about 400 nm, about 500 nm, about 600 nm, about 700 nm, about 800 nm, about 900 nm, about 950 nm, about 1,000 nm, about 1,100 nm, about 1,200 nm.

In some embodiments, the aluminum precursor contains one or more aluminum precursors. In embodiments, the first reactant contains one or more reducing agents, one or more oxidizing agents, one or more nitriding agents, one or more silicon precursors, one or more carbon precursors, or any combination thereof. Non-limiting examples of reactants include reducing agents, oxidizing agents such as water, ozone ($O_3$), carbon monoxide (CO), carbon dioxide ($CO_2$), ammonia ($NH_3$), hydrogen ($H_2$), metal organic silicon containing compounds such as tetraethyl orthosilicate (TEOS), silicon tetrachloride ($SiCl_4$) and the like. In embodiments, the aluminum containing layer 220 can be or include metallic aluminum, aluminum oxide, aluminum nitride, aluminum silicide, aluminum carbide, or any combination thereof. In embodiments, the aluminum containing layer 220 can be or include aluminum oxide, aluminum nitride, or any combination thereof. In embodiments, the aluminum containing layer 220 is aluminum oxide. In embodiments, the aluminum containing layer 220 is aluminum nitride.

In some embodiments, the aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate (Al(acac)3, also known as, tris(2, 4-pentanediono) aluminum), aluminum hexafluoroacefylacefonate (Al(hfac)3), trisdipivaloylmethanatoaluminum ($DPM_3Al$; (On HigC bAl), isomers thereof, complexes thereof, abducts thereof, salts thereof, or any combination thereof.

In some embodiments, suitable deposition temperatures include temperatures of 100 degrees Celsius to 400 degrees Celsius. In some embodiments, trimethylalurninum (deposited at a temperature of about 100° C. to about 400° C.) is delivered to the semiconductor manufacturing apparatus component 202 via vapor phase delivery for at pre-determined pulse length of 0.1 seconds. During processing, the deposition reactor is operated under a flow of nitrogen carrier gas (100 sccm to 10,000 sccm) such as about 1,500 sccm) with the chamber held at a pre-determined temperature of about 200° C. to about 400° C., or about 210° C. to about 350° C. and pressure about 1 Torr to about 10 Torr such as about 2.0 Torr After the pulse of trimethylaluminum, the chamber is then subsequently purged of all requisite gases and byproducts for a determined amount of time. Subsequently, water vapor is pulsed into the chamber for about 0.1 seconds at chamber pressure of about 1.5-3.0 Torr such as about 2.0 Torr or 2.0 Torr. An additional chamber purge is then performed to rid the reactor of any excess reactants and reaction byproducts. An additional purge may be performed after deposition during a chamber cooldown period. In some embodiments, the process is repeated as many times as necessary to get the semiconductor manufacturing apparatus component 202 coated with a coating comprising or consisting of $Al_2O_3$ film to the desired film thickness or a preselected film thickness. In some embodiments, the semiconductor manufacturing apparatus component 202 may be subjected to further downstream processing such as annealing at a temperature of up to 1000° C. such as about 500° C. under inert nitrogen flow of e.g., about 500 sccm for up to 24 hours, or about one hour.

In some embodiments, the present disclosure relates to a method of depositing a coating on a semiconductor manufacturing apparatus component, including: sequentially exposing a a semiconductor manufacturing apparatus component comprising nickel or nickel alloy to an aluminum precursor and a reactant to form an aluminum containing layer on a surface of the semiconductor manufacturing apparatus component by a deposition process. In some embodiments, the aluminum precursor is trimethylaluminum and the reactant is water. In some embodiments, the aluminum containing layer is deposited to a thickness of 100 to 1000 nanometers. In some embodiments, the deposition process is an atomic layer deposition (ALD) process, a plasma-enhanced ALD (PE-ALD) process, a thermal chemical vapor deposition (CVD) process, a plasma-enhanced CVD (PE-CVD) process, or any combination thereof. In some embodiments, the atomic layer deposition (ALD) process comprises contacting the semiconductor manufacturing apparatus component with the aluminum precursor at a temperature between 100 to 400 degrees Celsius at a pressure of 1 to 10 Torr. In some embodiments, the aluminum containing layer is metallic aluminum, aluminum oxide, aluminum nitride, aluminum silicide, aluminum carbide, or any combination thereof. In some embodiments, the aluminum oxide is $Al_2O_3$. In some embodiments, the methods further include depositing a buffering layer directly atop the semiconductor manufacturing apparatus component comprising nickel or nickel alloy, and forming the aluminum containing layer directly atop the buffering layer. In some embodiments, the depositing of the buffer layer is an atomic layer deposition (ALD) process. In some embodiments, the buffering layer comprises yttrium oxide, titanium oxide, titanium nitride, or combinations thereof. In some embodiments, the buffering layer forms an adhesive layer between the semiconductor manufacturing apparatus component comprising nickel or nickel alloy and the aluminum containing layer. In some embodiments, the semiconductor manufacturing apparatus component is a showerhead. In some embodiments, the semiconductor manufacturing apparatus component is a showerhead having an outer surface or top surface comprising or consisting of nickel, nickel alloy, or combinations thereof.

Figure 3:
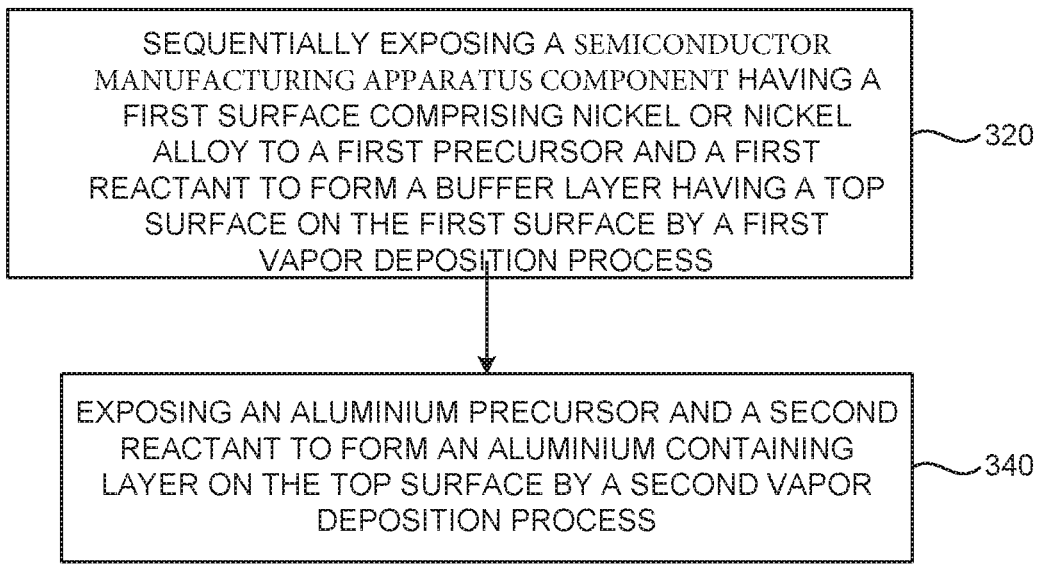
FIG. 3 depicts a flow chart of a method of depositing a coating on a semiconductor manufacturing apparatus component in accordance with some embodiments of the present disclosure.
Figure 4A:
FIGS. 4A-4C depict the stages of depositing a coating on a semiconductor manufacturing apparatus component in accordance with some embodiments of the present disclosure.
Figure 4B:
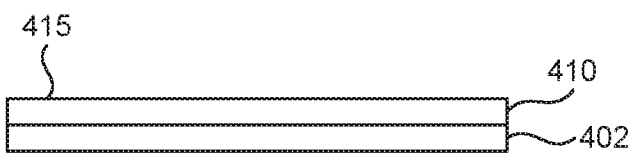
Figure 4C:
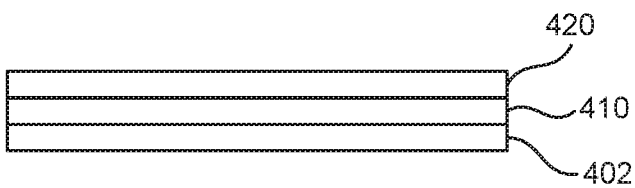

FIG. 3 is a flow chart of a method 300 for depositing a coating on one or more semiconductor manufacturing components, according to one or more embodiments described and discussed herein. FIGS. 4A-4C depict the stages of depositing a coating on a semiconductor manufacturing apparatus component in accordance with method 300. FIG. 5 depicts a deposition chamber including various components suitable for coating in accordance with the present disclosure.

Referring now to FIG. 3, a method 300 of depositing a coating on a semiconductor manufacturing apparatus component, includes, at block 320 sequentially exposing a semiconductor manufacturing apparatus component having a first surface comprising nickel or nickel alloy to a first precursor and a first reactant to form a buffer layer having a top surface on the first surface by a first vapor deposition process; and at block 340 exposing an aluminum precursor and a reactant to form an aluminum containing layer on the top surface by a second vapor deposition process.

In some embodiments, at block 320 the semiconductor manufacturing apparatus component 402 can be exposed to a first precursor and a first reactant to form a buffer layer 410 having a top surface 415 on the semiconductor manufacturing apparatus component 402 by a vapor deposition process, as depicted in FIG. 4A. The vapor deposition process can be an ALD process, a plasma-enhanced ALD (PE-ALD) process, a thermal chemical vapor deposition (CVD) process, a plasma-enhanced CVD (PE-CVD) process, or any combination thereof. In one or more embodiments, the vapor deposition process is an ALD process and the method includes sequentially exposing the surface of the semiconductor manufacturing apparatus component 402 to the first precursor and the first reactant to form the buffer layer. Each cycle of the ALD process includes exposing the surface 411 of the semiconductor manufacturing apparatus component 402 to the first precursor, conducting a purge, exposing the semiconductor manufacturing apparatus component 402 to the first reactant, and conducting a purge to form the buffer layer 410. The cycles may repeat until a buffer layer having a predetermined thickness is obtained. In some embodiments, the order of the first precursor and the first reactant can be reversed, so the ALD cycle includes exposing the surface 411 of the semiconductor manufacturing apparatus component 402 to the first reactant, conducting a purge, exposing the semiconductor manufacturing apparatus component 402 to the first precursor, and conducting a pumppurge to form the buffer layer 410.

In some embodiments, during each ALD cycle, the semiconductor manufacturing apparatus component 402 is exposed to the first precursor for about 0.1 seconds to about 10 seconds, the first reactant for about 0.05 seconds to about 10 seconds, and the purge for about 0.5 seconds to about 30 seconds. In some embodiments, during each ALD cycle, the semiconductor manufacturing apparatus component 402 is exposed to the first precursor for about 0.05 seconds to about 3 seconds, the first reactant for about 0.05 seconds to about 3 seconds, and the purge for about 1 second to about 10 seconds.

In some embodiments, each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, about 2000, about 3000, about 4000, about 5000, about 6000 or more times to form the buffer layer 410. In embodiments, each ALD cycle is repeated until a predetermined thickness of buffer layer 410 is obtained.

In some embodiments, the vapor deposition process is a CVD process and the method includes simultaneously exposing the semiconductor manufacturing apparatus component 402 to the first precursor and the first reactant to form the buffer layer 410. During an ALD process or a CVD process, each of the first precursor and the first reactant can independent include one or more carrier gases. One or more purge gases can be flowed across the semiconductor manufacturing apparatus component 402 and/or throughout the processing chamber in between the exposures of the first precursor and the first reactant in some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In embodiments, the buffer layer 410 can have a thickness of about 0.1 nm to 100 nm such as about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, about 150 nm, about 200 nm, about 300 nm, about 400 nm, about 500 nm, about 600 nm, about 700 nm, about 800 nm, or about 900 nm.

In some embodiments, the first precursor contains one or more precursors. The first reactant contains one or more reducing agents, one or more oxidizing agents, one or more nitriding agents, one or more silicon precursors, one or more carbon precursors, or any combination thereof. In embodiments, the first reactant contains one reducing agent, one oxidizing agent, one nitriding agent, one silicon precursors, or one carbon precursors.

In some embodiments, the first precursor is a titanium precursor and may include one or more of titanium cyclopentadiene compounds, one or more of titanium amino compounds, one or more of titanium alkyl compounds, one or more of titanium alkoxy compounds, substitutes thereof, complexes thereof, abducts thereof, salts thereof, or any combination thereof. Exemplary titanium precursors can be or include bis(methylcyclopentadiene) dimethyltitanium ((MeCp)2TiMe2), bis(methylcyclopentadiene) methylmethoxytitanium, bis(cyclopentadiene) dimethyltitanium ((Cp)$_2$TiMe2), tetra(tert-butoxy) titanium, titanium isopropoxide ((iPrO˜Ti), tetrakis(dimethyiamino) titanium (TDMAT), tetrakis(diethylamino) titanium (TDEAT), tetrakis(ethylmethylamino) titanium (TEMAT), isomers thereof, complexes thereof, abducts thereof, salts thereof, or any combination thereof. In some embodiments, titanium precursor includes TiCl$_4$ and HCl as a byproduct, and TiNH$_x$Cl$_y$ adducts (wherein x and y are numbers).

In one or more examples, the buffering layer 410 is a titanium-containing layer which can be or include metallic titanium and the first reactant contains one or more reducing agents. Exemplary reducing agents can be or include hydrogen (H$_2$), ammonia, hydrazine, one or more hydrazine compounds, one or more alcohols, a cydohexadiene, a dihydropyrazine, an aluminum containing compound, abducts thereof, salts thereof, plasma derivatives thereof, or any combination thereof.

In some embodiments, the buffering layer 410 is a titanium-containing layer which can be or include titanium oxide and the first reactant contains one or more oxidizing agents. In other examples, the buffering layer 410 is a yttrium-containing layer which can be or include yttrium-oxide and the first reactant contains one or more oxidizing agents. In further examples, the buffering layer 410. Exemplary oxidizing agents can be or include water (e.g., steam), oxygen (O$_2$), atomic oxygen, ozone, nitrous oxide, one or more peroxides, one or more alcohols, plasmas thereof, or any combination thereof.

In some embodiments, the buffering layer 410 is a titanium-containing layer which can be or include titanium nitride and the first reactant contains one or more nitriding agents.

Referring to FIG. 3 at block 340 the semiconductor manufacturing apparatus component is exposed to a second precursor such as an aluminum precursor described above and a second reactant such as reactants described above to form the aluminum containing layer 420 on the buffering layer 410 by an ALD process. In some embodiments, the buffering layer 410 and aluminum containing layer 420 have different compositions from each other. In some examples, the first precursor is a different precursor than the second precursor, so the first precursor is a source of a first type of metal and the second precursor is a source of a second type of metal and the first and second types of metal are different. For example, in embodiments, the first type of metal is devoid of aluminum, and the second type of metal comprises aluminum such as aluminum oxide.

In embodiments, the second precursor can be or include one or more aluminum precursors. In some embodiments, the second reactant can be or include one or more reducing agents, one or more oxidizing agents such as water, one or more nitriding agents, one or more silicon precursors, one or more carbon precursors, or any combination thereof, as described and discussed above. During the ALD process, each of the aluminum precursor and the second reactant can independent include one or more carrier gases. One or more purge gases can be flowed across the semiconductor manufacturing apparatus component 402 and/or throughout the processing chamber in between the exposures of the second precursor and the second reactant. In some examples, the same gas may be used as a carrier gas and a purge gas. Exemplary carrier gases and purge gases can independently be or include one or more of nitrogen (N$_2$), argon, helium, neon, hydrogen (H$_2$), or any combination thereof.

In embodiments, the aluminum containing layer 420 contains aluminum oxide, aluminum nitride, or any combination thereof. In one or more examples, if the buffer layer 410 contains or comprises yttrium oxide, titanium oxide, titanium nitride or combinations thereof, then the aluminum containing layer 420 contains aluminum oxide or aluminum nitride.

In embodiments, each cycle of the ALD process includes exposing the semiconductor manufacturing apparatus component 402 to the aluminum precursor, conducting a purge, exposing the semiconductor manufacturing apparatus component 402 to the second reactant, and conducting a purge to form the second deposited layer such as the aluminum containing layer 420. The order of the second precursor and the second reactant can be reversed.

In embodiments, during each ALD cycle, the semiconductor manufacturing apparatus component 402 including the buffer layer 410 is exposed to the second precursor such as aluminum precursor for about 0.05 seconds to about 10 seconds, the second reactant for about 0.05 seconds to about 10 seconds, and the purge may have a duration of about 0.5 seconds to about 30 seconds.

In some embodiments, each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, about 2,000, about 3,000, about 4,000, about 5,000, about 6,000, or more times to form the second deposited layer or aluminum containing layer 220.

In some embodiments, the second deposited layer such as aluminum containing layer 420 can have a thickness sufficient to protect the semiconductor manufacturing apparatus component 402 from harsh conditions as mentioned herein. In some embodiments, the aluminum containing layer 420 can have a thickness of about 1.0 nm to 1,000 nm, for example, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, about 150 nm, about 200 nm, about 300 nm, about 400 nm, about 500 nm, about 600 nm, about 700 nm, about 800 nm, about 900 nm, about 950 nm, about 1000 nm. In embodiments, the deposition cycle may be repeated until the desired or preselected thickness of the aluminum containing layer is achieved.

In embodiments, the buffer layer is deposited to a thickness of up to 100 nm, and the second deposited layer such as aluminum oxide is deposited to a thickness of up to 1,000 nm.

In some embodiments, the aluminum containing layer is subjected to further processing such as annealing to heat and densify the material of the aluminum containing layer. The annealing process can be or include a thermal anneal, a plasma anneal, an ultraviolet anneal, a laser anneal, or any combination thereof.

In one or more embodiments, the protective coatings including the aluminum containing layer 420 and buffer layer 410 can have a relatively high degree of uniformity. The protective coatings can have a uniformity of less than 50%, less than 40%, or less than 30% of the thickness of the respective protective coating. In some embodiments, the aluminum containing layer 420 and buffer layer 410 can each have a relatively high uniformity requirement such as less than 10%, or less than 5%, such as 1 to 4.5%.

In some embodiments, a method of depositing a coating on a semiconductor manufacturing apparatus component, includes: sequentially exposing a semiconductor manufacturing apparatus component having a first surface comprising nickel or nickel alloy to a first precursor and a first reactant to form a buffer layer having a top surface on the first surface by a first vapor deposition process; and exposing an aluminum precursor and a second reactant to form an aluminum containing layer on the top surface by a second vapor deposition process. In some embodiments, the aluminum precursor is trimethylaluminum and the reactant is water. In some embodiments, the aluminum containing layer is deposited on the top surface to a thickness of 100 to 1000 nanometers. In some embodiments, the first vapor deposition process and second vapor deposition process are an atomic layer deposition (ALD) process. In some embodiments, wherein the first precursor is suitable for forming the buffer layer comprising yttrium oxide (YO), titanium oxide (TiO), or titanium nitride (TiN). In some embodiments, the second vapor deposition process is an atomic layer deposition (ALD) process further comprising contacting the top surface with the aluminum precursor at a temperature between 200 to 400 degrees Celsius at a pressure of 1 to 10 Torr. In some embodiments, the aluminum containing layer comprises or consists of $Al_2O_3$.

In some embodiments, a suitable deposition chamber for depositing the buffering layer such as buffer layer 410 and aluminum containing layer 220 or aluminum containing layer 420 is a deposition process chamber configured to hold the components or parts thereof of the process chamber, such as deposition process chamber 500 is available from Applied Materials, Inc. located in Santa Clara, Calif. In some embodiments, the coating deposition chamber is a batch style reactor and deposition of buffer layer 410 and aluminum containing layer 220 or aluminum containing layer 420 may occur ex-situ.

In embodiments, the deposition process chamber 500 includes components which may be wholly or partially coated with a protective coating of the present disclose. In embodiments, the deposition process chamber 500 may be part of a processing system shown in FIG. 6 including multiple processing chambers connected to a central transfer chamber and serviced by a robot. The deposition process chamber 500 includes walls 506, a bottom 508, and a lid 510 defining a process volume 512. The walls 506 and bottom 508 are typically fabricated from a unitary block of aluminum; however, may have a nickel or nickel alloy surface as described above suitable for coating in accordance with the present disclosure. The walls 506 may have conduits (not shown) therein through which a fluid may be passed to control the temperature of the walls 506. The deposition process chamber 500 may also include a pumping ring 514 coupling the process volume 512 to an exhaust port 516 as well as other pumping components (not shown). A substrate support assembly 538, which may be heated, may be centrally disposed within the deposition process chamber 500. The substrate support assembly 538 supports a substrate 503 during a deposition process. The substrate support assembly 538 generally is fabricated from aluminum, ceramic or a combination of aluminum and ceramic and typically includes a vacuum port (not shown) and at least one or more heating elements 532.

In embodiments, a vacuum port may be used to apply a vacuum between the substrate 503 and the substrate support assembly 538 to secure the substrate 503 to the substrate support assembly 538 during the deposition process. The one or more heating elements 532, may be, for example, electrodes disposed in the substrate support assembly 538, and coupled to a power source 530, to heat the substrate support assembly 538 and substrate 503 positioned thereon to a predetermined temperature.

In embodiments, the substrate support assembly 538 is coupled to a stem 542. The stem 542 provides a conduit for electrical leads, vacuum and gas supply lines between the substrate support assembly 538 and other components of the deposition process chamber 500. Additionally, the stem 542 couples the substrate support assembly 538 to a lift system 544 to move the substrate support assembly 538 between an elevated position (as shown in FIG. 5) and a lowered position (not shown). Bellows 546 provide a vacuum seal between the process volume 512 and the atmosphere outside the deposition process chamber 500 while facilitating the movement of the substrate support assembly 538.

The substrate support assembly 538 additionally supports a circumscribing shadow ring 548. The shadow ring 548 is annular in form and typically comprises a ceramic material such as, for example, aluminum nitride. Generally, the shadow ring 548 prevents deposition at the edge of the substrate 503 and substrate support assembly 538.

The lid 510 is supported by the walls 506 and may be removable to allow for servicing of the deposition process chamber 500. The lid 510 may generally be comprised of aluminum and may additionally have heat transfer fluid channels 524 formed therein. The heat transfer fluid channels 524 are coupled to a fluid source (not shown) flowing a heat transfer fluid through the lid 510. Fluid flowing through the heat transfer fluid channels 524 regulates the temperature of the lid 510.

A mixing block 534 may be disposed in the lid 510. The mixing block 534 may be coupled to gas sources 504. Generally, individual gas streams from the gas sources 504 may be combined in the mixing block 534. These gases are mixed into a single homogeneous gas flow in the mixing block 534 and introduced into the process volume 512 after passing through a showerhead 518 diffusing the gas flow outwardly towards the walls 506.

The showerhead 518 may generally be coupled to an interior side 520 of the lid 510. In embodiments, showerhead 518 is wholly or partially comprised of nickel or nickel alloy as described above, wherein the nickel or nickel alloy is in a position suitable for coating in accordance with the present disclosure. A perforated blocker plate 536 may optionally be disposed in the space 522 between the showerhead 518 and lid 510. Gases (i.e., process and other gases) may enter the deposition process chamber 500 through the mixing block 534 are first diffused by the blocker plate 536 as the gases fill the space 522 behind the showerhead 518. The gases then pass through the showerhead 518 and into the deposition process chamber 500. The blocker plate 536 and the showerhead 518 are configured to provide a uniform flow of gases to the deposition process chamber 500.

In some embodiments, at least one of the lines supplying process gas, such as a first or second precursor in accordance with the present disclosure, from gas sources 504 to deposition process chamber 500 advantageously includes a valve (not shown) for diverting gas flow, so during purging of the deposition process chamber 500 the mass flow controller (MFC) for the precursor gas source does not need to be shut off. Diverting the flow of the precursor during purge steps, as opposed to shutting off the flow, reduces overall throughput time by eliminating the extra time needed for the MFC to stabilize the flow of precursor after each purge step.

The deposition process chamber 500 can be controlled by a microprocessor controller 554. The microprocessor controller may be one of any form of general purpose computer processor or central processing unit (CPU) suitable for use in an industrial setting for controlling various chambers and sub-processors. The computer processor may use any suitable memory, such as random access memory, read only memory, floppy disc drive, hard disk, or any other form of digital storage, local or remote. Various support circuits may be coupled to the CPU for supporting the processor in a conventional manner. Software routines, as required, may be stored in the memory or executed by a second CPU remotely located.

The software routines are executed after the substrate is positioned on the substrate support. The software routines, when executed, transform the general purpose computer into a specific process computer to control the chamber operation so a chamber process is performed. Alternatively, the software routines may be performed in hardware as an application specific integrated circuit or other type of hardware implementation, or a combination of software and hardware.

In embodiments a deposition process chamber is configured for depositing a coating on a semiconductor manufacturing apparatus component, including sequentially exposing a semiconductor manufacturing apparatus component comprising nickel or nickel alloy to an aluminum precursor and a reactant to form an aluminum containing layer on a surface of the semiconductor manufacturing apparatus component by a deposition process. In embodiments, the deposition process chamber is configured for depositing one or more layers of the present disclosure under conditions described hereinabove. In embodiments, a chamber such as deposition process chamber 500 is sized to accommodate the deposition processing chamber 500 parts or portions thereof for coating. The chamber may also include a microprocessor controller with memory for a non-transitory computer readable medium having instructions stored thereon that, when executed, cause a chamber to deposit a coating on a semiconductor manufacturing apparatus component, by sequentially exposing a semiconductor manufacturing apparatus component including nickel or nickel alloy to an aluminum precursor and a reactant to form an aluminum containing layer on a surface of the semiconductor manufacturing apparatus component by a deposition process.

In some embodiments, the present disclosure relates to a semiconductor manufacturing apparatus component, including: an aluminum containing layer disposed on a nickel or nickel alloy surface of the semiconductor manufacturing apparatus component, wherein the semiconductor manufacturing apparatus component is one or more of a showerhead, a wall, a lid, a ring, a bottom, a blocker plate, or a substrate support assembly.

In some embodiments, the present disclosure relates to a processing chamber, including: an aluminum containing layer disposed on a nickel or nickel alloy surface of the processing chamber or a component thereof, wherein the processing chamber includes a semiconductor manufacturing apparatus component such as a showerhead, a wall, a lid, a ring, a bottom, a blocker plate, or a substrate support assembly, or combinations thereof.

Figure 6:
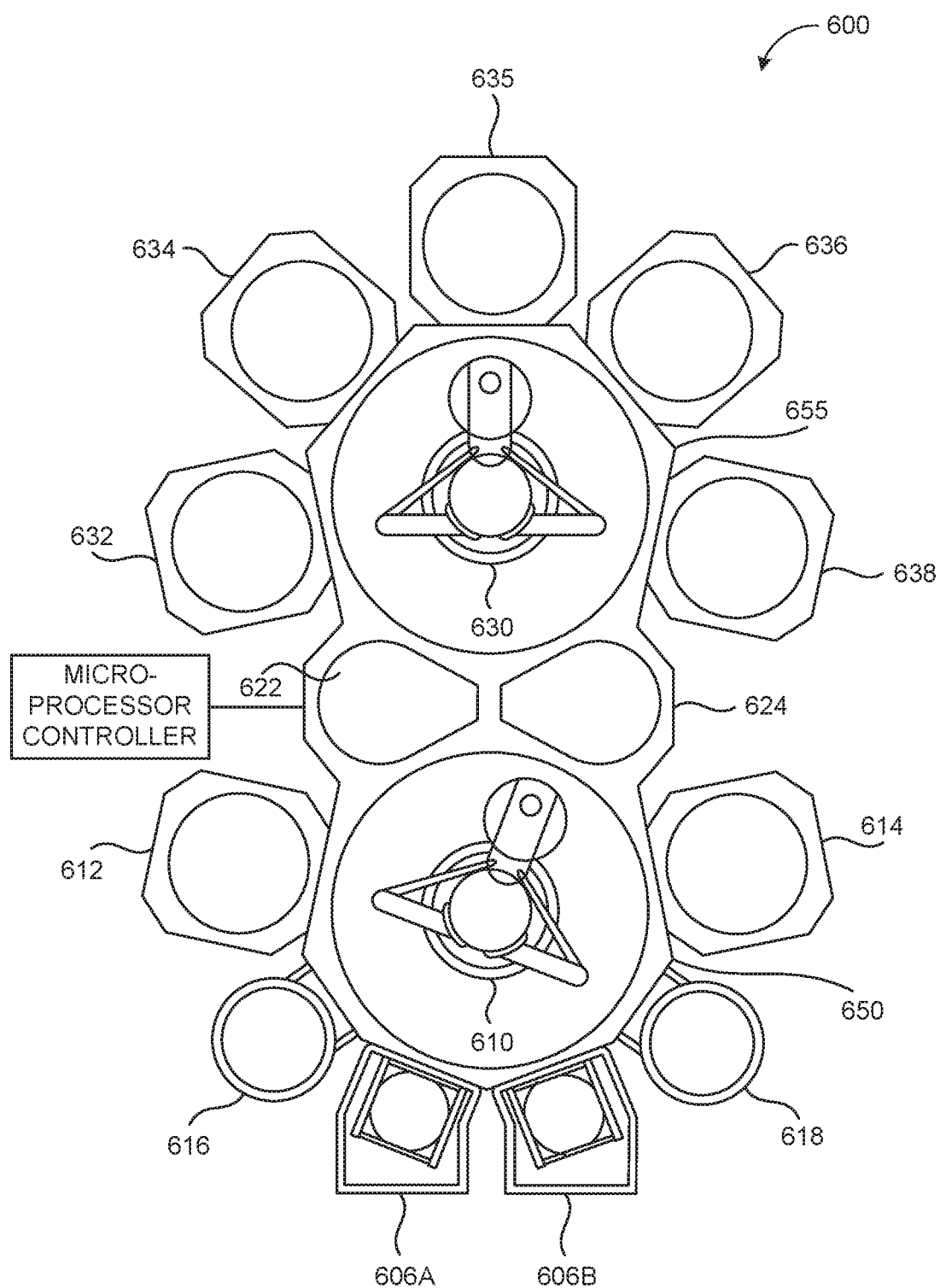
FIG. 6 depicts a cluster tool suitable for performing one or more methods in accordance with some embodiments of the present disclosure.

The methods described herein may be performed in individual process chambers and may be provided in a standalone configuration or as part of one or more cluster tools including chambers, components or parts thereof coated in accordance with the present disclosure, for example, an integrated tool 600 (i.e., cluster tool) described below with respect to FIG. 6. Examples of the integrated tool 600 include the ENDURA®, CENTURA®, or PRODUCER® line of processing systems, available from Applied Materials, Inc., of Santa Clara, Calif. However, the methods described herein may be practiced using other cluster tools having suitable process chambers coupled thereto, or in other suitable process chambers.

The integrated tool 600 can include two load lock chambers 606A, 606B for transferring of substrates into and out of the integrated tool 600. Typically, since the integrated tool 600 is under vacuum, the load lock chambers 606A, 606B may pump down the pressure within the load lock chambers when substrates are introduced into the integrated tool 600. A first robot 610 may transfer the substrates between the load lock chambers 606A, 606B, and a first set of one or more substrate processing chambers 612, 614, 616, 618 (four are shown) coupled to a first transfer chamber 650. Each substrate processing chamber 612, 614, 616, 618, can be outfitted to perform a number of substrate processing operations. In some embodiments, the first set of one or more substrate processing chambers 612, 614, 616, 618 may include any combination of PVD, ALD, CVD, etch, degas, or pre-clean chambers. For example, in some embodiments, the processing chambers, 612, 614, 616, 618 include two pre-clean chambers and two degas chambers.

The first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 630 can transfer the substrates between the intermediate transfer chambers 622, 624 and a second set of one or more substrate processing chambers 632, 634, 635, 636, 638 coupled to a second transfer chamber 655. The substrate processing chambers 632, 634, 635, 636, 638 can be outfitted to perform a variety of substrate processing operations including the methods described above in addition to, physical vapor deposition processes (PVD), chemical vapor deposition (CVD), etching, orientation and other substrate processes. In embodiments, the cluster tool is configured to include chambers configured for forming the interconnect structures in accordance with the present disclosure.

In some embodiments, the present disclosure relates to a non-transitory computer readable medium having instructions stored thereon that, when executed, cause a deposition chamber to deposit a coating on a semiconductor manufacturing apparatus component, by sequentially exposing a substrate including nickel or nickel alloy to an aluminum precursor and a reactant to form an aluminum containing layer on a surface of the semiconductor manufacturing apparatus component by a deposition process.

In some embodiments, the present disclosure relates to a non-transitory computer readable medium having instructions stored thereon that, when executed, cause a deposition chamber to deposit a coating on a semiconductor manufacturing apparatus component, by sequentially exposing a semiconductor manufacturing apparatus component having a first surface comprising nickel or nickel alloy to a first precursor and a first reactant to form a buffer layer having a top surface on the first surface by a first vapor deposition process; and exposing an aluminum precursor and a second reactant to form an aluminum containing layer on the top surface by a second vapor deposition process.

While the foregoing is directed to embodiments of the present disclosure, other and further embodiments of the disclosure may be devised without departing from the basic scope thereof.

The invention claimed is:

1. A method of depositing a coating on a semiconductor manufacturing apparatus component using an atomic layer deposition process, comprising:

1) in a deposition reactor, contacting a semiconductor manufacturing apparatus component comprising nickel or nickel alloy with an aluminum precursor; followed by 2) contacting the semiconductor manufacturing apparatus component comprising nickel or nickel alloy with a reactant; followed by 3) purging the deposition reactor; followed by repeating 1, 2, and 3 to form an aluminum containing layer on a surface of the semiconductor manufacturing apparatus component comprising nickel or nickel alloy; and annealing the aluminum containing layer at a temperature of up to 1000 degrees Celsius in a nitrogen atmosphere.

2. The method of claim 1, wherein the aluminum precursor is trimethylaluminum and the reactant is water.

3. The method of claim 1, wherein the aluminum containing layer is deposited to a thickness of 100 to 1000 nanometers.

4. The method of claim 1, wherein the contacting the semiconductor manufacturing apparatus component with the aluminum precursor is at a temperature between 100 to 450 degrees Celsius and at a pressure of 1 to 10 Torr.

5. The method of claim 1, wherein the aluminum containing layer comprises aluminum oxide, aluminum nitride, aluminum silicide, aluminum carbide, or any combination thereof.

6. The method of claim 1, wherein the aluminum containing layer is aluminum oxide.

7. The method of claim 1 further comprising:

prior to 1), depositing a buffering layer directly atop the semiconductor manufacturing apparatus component comprising nickel or nickel alloy, and forming the aluminum containing layer according to 1), 2), and 3) directly atop the buffering layer.

8. The method of claim 7, wherein the buffering layer comprises yttrium oxide, titanium oxide, titanium nitride, or combinations thereof.

9. The method of claim 7, wherein the buffering layer forms an adhesive layer between the semiconductor manufacturing apparatus component comprising nickel or nickel alloy and the aluminum containing layer.

10. The method of claim 1, wherein the semiconductor manufacturing apparatus component is a showerhead.

11. The method of claim 1, wherein the aluminum containing layer has a thickness of 200 to 1500 nm.

12. The method of claim 1, wherein the contacting the semiconductor manufacturing apparatus component comprising nickel or nickel alloy with the aluminum precursor is for about 0.05 seconds to about 10 seconds.

13. The method of claim 1, wherein the contacting the semiconductor manufacturing apparatus component comprising nickel or nickel alloy with the reactant is for about 0.05 seconds to about 10 seconds.

14. The method of claim 1, wherein the purging the deposition reactor is for about 0.5 seconds to about 30 seconds.

15. The method of claim 1, wherein 1, 2, and 3 are repeated at least 10 times.

16. The method of claim 1, wherein 1, 2, and 3 are repeated at least 100 times.

17. The method of claim 1, wherein 1, 2, and 3 are repeated at least 1000 times.

* * * * *